United States Patent
Ishii

(10) Patent No.: US 6,390,018 B1
(45) Date of Patent: *May 21, 2002

(54) MICROWAVE PLASMA TREATMENT APPARATUS

(75) Inventor: Nobuo Ishii, Yamanashi-ken (JP)

(73) Assignee: Tokyo Electron Limited, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/865,070

(22) Filed: May 29, 1997

(30) Foreign Application Priority Data

May 31, 1996 (JP) .............................................. 8-161188

(51) Int. Cl.[7] ............................................. C23C 16/511
(52) U.S. Cl. ....................... 118/723 MR; 118/723 MW; 118/723 ME; 118/723 MA
(58) Field of Search .............................. 315/39, 111.21; 372/82

(56) References Cited

U.S. PATENT DOCUMENTS

| | | | |
|---|---|---|---|
| 4,414,488 A | * 11/1983 | Hoffmann et al. | ............. 315/39 |
| 4,866,346 A | 9/1989 | Gaudreau et al. | |
| 5,043,995 A | * 8/1991 | Lackner | ....................... 372/82 |
| 5,234,526 A | 8/1993 | Chen et al. | |
| 5,517,085 A | * 5/1996 | Engemann et al. | ...... 315/111.21 |
| 5,646,489 A | * 7/1997 | Kakehi et al. | .......... 315/111.21 |

FOREIGN PATENT DOCUMENTS

| | | |
|---|---|---|
| JP | 5 74592 | 3/1993 |
| JP | 6 41633 | 6/1994 |

* cited by examiner

Primary Examiner—Gregory Mills
Assistant Examiner—Rudy Zervigon
(74) Attorney, Agent, or Firm—Oblon, Spivak, McClelland, Maier & Neustadt, P.C.

(57) ABSTRACT

A microwave plasma treatment apparatus according to the present invention comprises a microwave generating section for generating $TE_{11}$-mode microwaves, a circular waveguide for propagating the $TE_{11}$-mode microwaves generated from the microwave generating section, a plasma generating section for generating a plasma by using the $TE_{11}$-mode microwaves propagated through the circular waveguide, and a treatment chamber for treating an object of treatment with the plasma generated by the plasma generating section. Those inner surface regions of the circular waveguide which are opposed to each other in the electric-field direction of the microwaves are deformed so that the electric-field intensity of the $TE_{11}$-mode microwaves is substantially uniform in the magnetic-field direction of the microwaves.

12 Claims, 3 Drawing Sheets

F I G. 2A
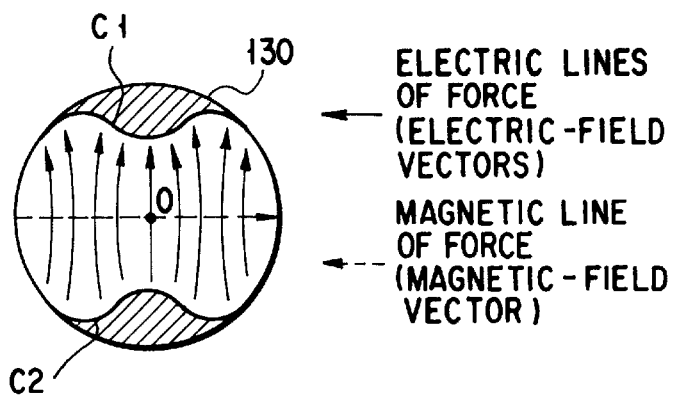
F I G. 2B
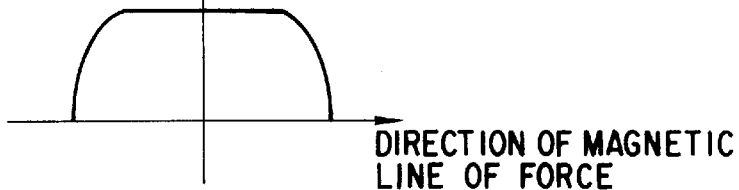
F I G. 3A
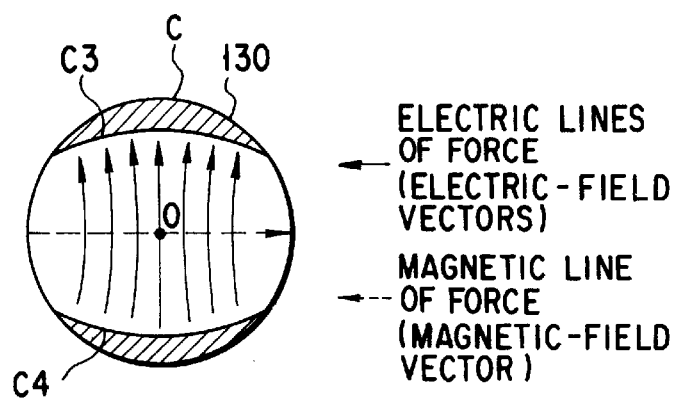
F I G. 3B
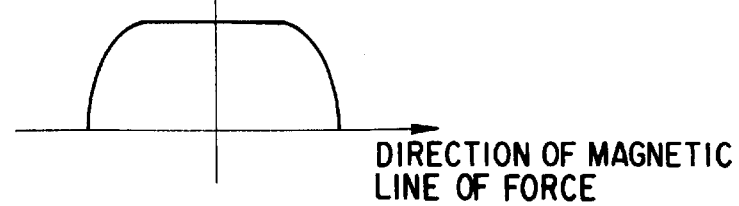

F I G. 4A
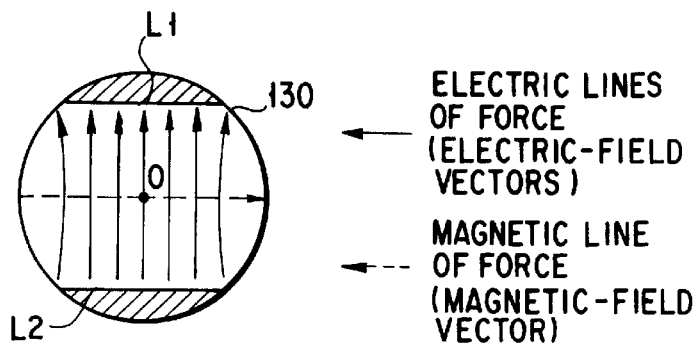
← ELECTRIC LINES OF FORCE (ELECTRIC-FIELD VECTORS)
←-- MAGNETIC LINE OF FORCE (MAGNETIC-FIELD VECTOR)
F I G. 4B
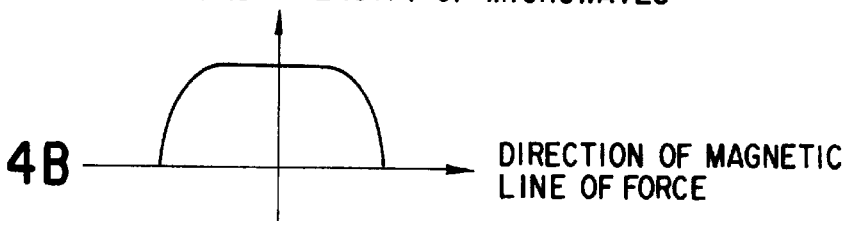
F I G. 5A
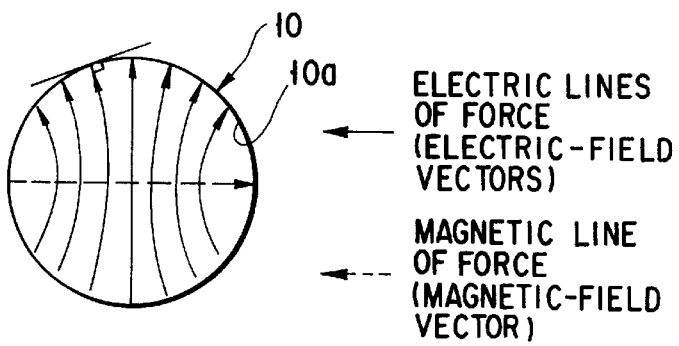
← ELECTRIC LINES OF FORCE (ELECTRIC-FIELD VECTORS)
←-- MAGNETIC LINE OF FORCE (MAGNETIC-FIELD VECTOR)
F I G. 5B
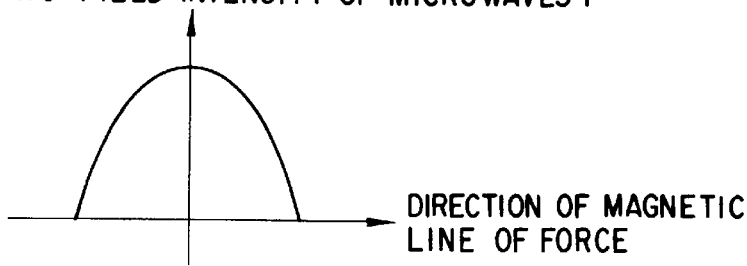

MICROWAVE PLASMA TREATMENT APPARATUS

BACKGROUND OF THE INVENTION

The present invention relates to a microwave plasma treatment apparatus for subjecting objects of treatment, such as semiconductor wafers, to etching and other specific treatments with plasmas formed by using microwaves.

An ECR (electron cyclotron resonance) etching apparatus, as an example of a microwave plasma treatment apparatus, comprises a treatment chamber (etching chamber) and a plasma generating chamber. Set in the treatment chamber is a stage of, for example, stainless steel, which can carry thereon an object of treatment, such as a semiconductor wafer or LCD or glass substrate. The plasma generating chamber is connected with a waveguide that serves to propagate microwaves, generated by means of a magnetron of a microwave generator, to the plasma generating chamber.

In the ECR etching apparatus constructed in this manner, a specific treatment gas is introduced into the treatment chamber, and $TE_{11}$-mode microwaves (e.g., at 2.45 GHz), for example, are introduced into the a plasma generating chamber through the waveguide and an insulating wall. In the plasma generating chamber, a plasma is generated by microwave discharge, and reaction gases in the treatment gas are dissociated to produce radicals by the agency of the plasma. The plasma and radicals are guided to the stage that carries the object of treatment thereon, whereupon a to-be-treated film on the object is etched with them.

As compared with a conventional parallel-plate plasma treatment apparatus, the microwave plasma treatment apparatus of this type, having the following features, is better suited for highly fine working that is demanded these days.

[Features of Microwave Plasma Treatment Apparatus]

(1) Shape control can be effected with ease, covering varieties of etching from anisotropic etching to perfectly isotropic etching.

(2) The ionization ratio is high enough to ensure high-speed etching with lower ion energy that is less damaging.

(3) No-electrode discharge in a treatment chamber of, for example, quartz enables etching with fewer sources of pollution.

FIG. 5A is a sectional view of a waveguide 10 taken along a plane perpendicular to the direction of propagation of microwaves (axial direction of the waveguide 10), in which are described electric- and magnetic-field vectors of $TE_{11}$-mode microwaves (electromagnetic waves) propagated through the waveguide 10. TE waves (transverse electric waves) are electromagnetic waves whose electric-field vectors are always directed at right angles to the direction of propagation thereof. The $TE_{11}$-mode microwaves, in particular, are electromagnetic waves whose electric- and magnetic-field vectors are directed at right angles to one another and also to the advancing direction of the waves, as shown in FIG. 5A, and which are propagated in the circular waveguide, a path of propagation proper to them.

As is generally known, electric lines of force extend at right angles to an equipotential surface. Accordingly, the electric lines of force of microwaves that are propagated through a waveguide extend at right angles to the inner surface of the waveguide. In the case where an inner surface 10a of the waveguide 10 is formed having a circular cross section perpendicular to the axis of the waveguide, in order to propagate the $TE_{11}$-mode microwaves, therefore, those electric lines of force which do not pass the central portion of the waveguide 10 have high curvatures, as shown in FIG. 5A. More specifically, the curvatures (degrees of inward bend) of the electric lines of force become higher with distance from the central portion of the waveguide 10, in the direction of a magnetic line of force (magnetic-field direction), and lower with distance from the peripheral portion. Thus, the density of the electric lines of force becomes lower with distance from the central portion of the waveguide 10 in the direction of the magnetic line of force and higher with distance from the peripheral portion. In consequence, the electric-field intensity (P) of the microwaves becomes lower with distance from the central portion of the waveguide 10 in the direction of the magnetic line and higher with distance from the peripheral portion, as shown in FIG. 5B (electric-field intensity distribution of the microwaves in the direction of the magnetic line of force).

The electric-field intensity distribution of the microwaves is reflected in the density of plasmas excited in the plasma generating chamber. If it is uneven, as shown in FIG. 5B, the plasma density distribution also becomes uneven, so that the object of treatment may possibly fail to be subjected to a uniform plasma treatment.

BRIEF SUMMARY OF THE INVENTION

The object of the present invention is to provide a microwave plasma treatment apparatus capable of subjecting an object of treatment to a uniform plasma treatment by using $TE_{11}$-mode microwaves.

The above object of the invention is achieved by a microwave plasma treatment apparatus constructed as follows. The apparatus comprises microwave generating means for generating $TE_{11}$-mode microwaves, a circular waveguide for propagating the $TE_{11}$-mode microwaves generated from the microwave generating means, plasma generating means for generating a plasma by using the $TE_{11}$-mode microwaves propagated through the circular waveguide, and a treatment chamber for treating an object of treatment with the plasma generated by the plasma generating means. Those inner surface regions of the circular waveguide which are opposed to each other in the electric-field direction of the microwaves are deformed so that the electric-field intensity of the microwaves introduced in $TE_{11}$-mode is substantially uniform in the magnetic-field direction of the microwaves.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 2A is a view showing an example of the sectional shape of a circular waveguide along a plane perpendicular to the direction of propagation of microwaves, in which are described electric- and magnetic-field vectors of $TE_{11}$-mode microwaves propagated through the waveguide;

FIG. 2B is a diagram showing the electric-field intensity distribution of the microwaves shown in FIG. 2A in the direction of a magnetic line of force;

FIG. 3A is a view showing another example of the sectional shape of the circular waveguide along a plane perpendicular to the direction of propagation of microwaves, in which are described electric- and magnetic-field vectors of the $TE_{11}$-mode microwaves propagated through the waveguide;

FIG. 3B is a diagram showing the electric-field intensity distribution of the microwaves shown in FIG. 3A in the direction of a magnetic line of force;

FIG. 4A is a view showing still another example of the sectional shape of the circular waveguide along a plane perpendicular to the direction of propagation of microwaves, in which are described electric- and magnetic-field vectors of the $TE_{11}$-mode microwaves propagated through the waveguide;

FIG. 4B is a diagram showing the electric-field intensity distribution of the microwaves shown in FIG. 4A in the direction of a magnetic line of force;

FIG. 5A is a sectional view of a conventional circular waveguide taken along a plane perpendicular to the direction of propagation of microwaves, in which are described electric- and magnetic-field vectors of $TE_{11}$-mode microwaves propagated through the waveguide; and FIG. 5B is a diagram showing the electric-field intensity distribution of the microwaves shown in FIG. 5A in the direction of a magnetic line of force.

DETAILED DESCRIPTION OF THE INVENTION

Figure 1:
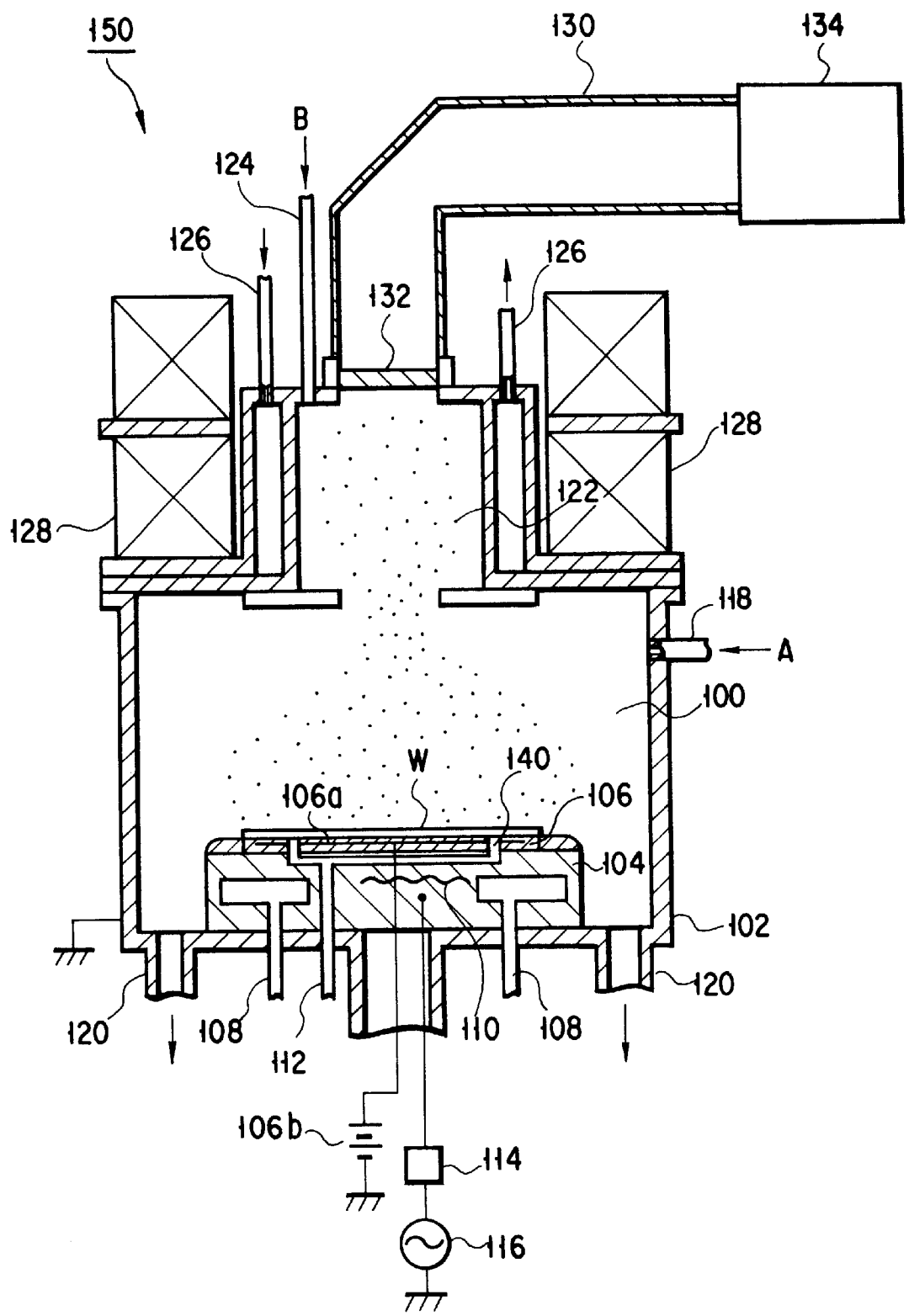
FIG. 1 is a sectional view schematically showing an ECR etching apparatus according to an embodiment of the present invention.

An embodiment of the present invention will now be described with reference to the accompanying drawings.

FIG. 1 shows an ECR etching apparatus 150 as a microwave plasma treatment apparatus. As shown in FIG. 1, the apparatus 150 comprises a treatment chamber (etching chamber) 100 and a plasma generating chamber 122. The treatment chamber 100 is defined in an airtight treatment vessel 102 that can be opened and closed. A stage 104 for use as an electrode is set in the vessel 102. A high-frequency power source 116 is connected to a matching circuit 114, which in turn is connected to the stage 104. The power source 116 is provided to supply high-frequency bias power to the stage 104. The stage 104 has an electrostatic chuck 106, which can hold an object of treatment, e.g., a semiconductor wafer W, on the stage 104 by electrostatic attraction. The chuck 106 is formed by embedding a planar electrode 106a in a film of an insulating material, such as polyimide resin. When high-voltage power from a DC power source 106b is applied to the electrode 106a, the chuck 106 attracts the wafer W by means of a coulomb force.

In order to adjust the temperature of the wafer W to a predetermined level, a cooling jacket 108 and a heater 110 are arranged in the stage 104. A refrigerant, such as ethylene glycol that is temperature-controlled by means of a chiller or the like, is circulated in the jacket 108. The stage 104 is provided with a large number of gas supply holes 140 opening in its upper surface that carries the wafer W thereon. These holes 140 are connected to a gas supply pipe 112, which is connected to a helium gas source (not shown). When helium gas at several Torr, for example, is introduced into the region between the wafer W and the stage 104 through the gas supply pipe 112 and the holes 140, in this arrangement, the rate of heat transfer between the wafer W and the stage 104 is improved through the medium of the helium gas, so that heat from the wafer W can be efficiently transferred to the stage 104. Thus, the temperature of the wafer W can be prevented from rising excessively.

The plasma generating chamber 122 for generating plasmas is coupled to the top portion of the treatment vessel 102. A circular waveguide 130 is connected to the chamber 122 through an insulating wall 132 that is formed of a dielectric such as quartz. The respective sectional shapes of the chamber 122 and the wall 132 that are perpendicular to the direction of propagation of microwaves are substantially identical with or similar to the sectional shape (mentioned later) of the waveguide 130.

The circular waveguide 130 is connected to a microwave generating chamber 134, and propagates $TE_{11}$-mode microwaves (e.g., at 2.45 GHz), which are generated by means of a magnetron in the chamber 134, into the plasma generating chamber 122. The magnetron in the chamber 134 forms $TE_{10}$-mode microwaves, which may be propagated through a rectangular waveguide, converted into $TE_{11}$-mode microwaves by means of a converter, and introduced into the circular waveguide 130.

In order to dissipate heat generated in the plasma generating chamber 122, a circuit 126 through which a cooling medium, such as water, is circulated is defined in the side wall portion of the chamber 122. A magnetic coil 128 is located around the chamber 122. The coil 128 forms a magnetic field of, for example, 875 G in the chamber 122 so that electrons undergo a cyclotron motion during electric discharge that is excited by the microwaves propagated in the chamber 122.

The side wall of the treatment vessel 102 is provided with a gas inlet pipe 118 at its upper part, through which a specific treatment gas A (e.g., gas mixture of carbon fluoride, oxygen, and argon) is introduced into the treatment chamber 100. The lower part of the vessel 102 is connected with exhaust pipes 120, which are connected to a vacuum pump (not shown). A top wall of the plasma generating chamber 122 is provided with a gas inlet pipe 124 through which a gas B (e.g., argon gas) for plasma generation is introduced into the chamber 122. In this arrangement, the specific treatment gases are introduced into the chambers 100 and 122 at constant rates through the pipes 118 and 124, individually. As the chambers 100 and 122 are evacuated through the exhaust pipes 120 by means of the vacuum pump, they are kept at predetermined pressures inside.

FIG. 2A is a sectional view of the circular waveguide 130 taken along a plane perpendicular to the direction of propagation of microwaves (axial direction of the waveguide 130). FIG. 2A shows electric- and magnetic-field vectors of the $TE_{11}$-mode microwaves that are propagated through the waveguide 130. In the sectional view of FIG. 2A, wavy curves C1 and C2 represent the top and bottom regions, respectively, of the inner surface of the circular waveguide 130 that are situated in the electric-field direction of the microwaves. The other inner surface regions of the waveguide 130 maintain the circular shape shown in FIG. 5A. Each of the curves C1 and C2 is symmetrical with respect to an axis that extends past the center O of the waveguide 130 in the electric-field direction. Also, the two curves C1 and C2 are symmetrical with respect to an axis that extends past the center 0 of the waveguide 130 in the magnetic-field direction. If the inner surface regions of the waveguide 130 that are situated in the electric-field direction of the microwaves are formed having the axially symmetrical wavy shape in this manner, electric lines of force (electric-field vectors) of the $TE_{11}$-mode microwaves extend at right angles to the inner surface of the circular waveguide 130 in a manner such that their curvatures are low. More specifically, the density concentration of the electric lines of force is eased inside the waveguide 130 so that the intervals between the electric lines are substantially uniform in the direction of a magnetic line of force. As shown in FIG. 2B, therefore, the electric-field intensity of the $TE_{11}$-mode microwaves is substantially uniform in the direction of the magnetic line of force (electric-field direction).

FIGS. 3A and 4A show alternative examples of the inner surface shape of the circular waveguide 130. Each of these drawings is a sectional view of the waveguide 130 taken along a plane perpendicular to the direction of propagation of microwaves (axial direction of the waveguide 130).

In the sectional view of FIG. 3A, arcuate curves C3 and C4 represent the top and bottom regions, respectively, of the inner surface of the circular waveguide 130 that are situated in the electric-field direction of the microwaves. The curves C3 and C4 have a curvature lower enough than that of a circular contour C of the waveguide 130. In other words, the radius of curvature of the curves C3 and C4 is greater enough than that of the contour C of the waveguide 130. The other inner surface regions of the waveguide 130 maintain the circular shape shown in FIG. 5A (having the same curvature as the contour C of the waveguide 130). Each of the curves C3 and C4 is symmetrical with respect to an axis that extends past the center O of the waveguide 130 in the electric-field direction. Also, the two curves C3 and C4 are symmetrical with respect to an axis that extends past the center 0 of the waveguide 130 in the magnetic-field direction. If the inner surface regions of the waveguide 130 that are situated in the electric-field direction of the microwaves are formed having the axially symmetrical low-curvature arcuate shape in this manner, electric lines of force (electric-field vectors) of the $TE_{11}$-mode microwaves extend at right angles to the inner surface of the circular waveguide 130 in a manner such that their curvatures are low. More specifically, the density concentration of the electric lines of force is eased inside the waveguide 130 so that the intervals between the electric lines are substantially uniform in the direction of a magnetic line of force. As shown in FIG. 3B, therefore, the electric-field intensity of the $TE_{11}$-mode microwaves is substantially uniform in the direction of the magnetic line of force.

In the sectional view of FIG. 4A, parallel straight lines L1 and L2 represent the top and bottom regions, respectively, of the inner surface of the circular waveguide 130 that are situated in the electric-field direction of the microwaves. The lines L1 and L2 are parallel to an axis that extends past the center O of the waveguide 130 in the magnetic-field direction. The other inner surface regions of the waveguide 130 maintain the circular shape shown in FIG. 5A. If the inner surface regions of the waveguide 130 that are situated in the electric-field direction of the microwaves are formed having the flat shape in this manner, electric lines of force (electric-field vectors) of the $TE_{11}$-mode microwaves extend substantially straight at right angles to the inner surface of the circular waveguide 130. More specifically, the density of the electric lines of force is not concentrated inside the waveguide 130, and the intervals between the electric lines are substantially uniform in the direction of a magnetic line of force. As shown in FIG. 4B, therefore, the electric-field intensity of the $TE_{11}$-mode microwaves is substantially uniform in the direction of the magnetic line of force.

The following is a description of a case in which a silicon oxide film, for example, formed on the wafer W is etched by using the ECR etching apparatus 150 constructed in the aforementioned manner.

When the wafer W is first placed on the stage 104 in the treatment chamber 100, high-voltage power from the DC power source 106b is applied to the electro-static chuck 106 on the stage 104, whereupon the wafer W is held on the stage 104 by attraction. At this point of time, the stage 104 is kept at a predetermined temperature, e.g., 25° C., by means of the refrigerant circulated in the cooling jacket 108 and heat generated by the heater 110.

Then, the specific treatment gas A, e.g., gas mixture of carbon fluoride, oxygen, argon, etc., is introduced into the treatment chamber 100 through the gas inlet pipe 118, while the gas B for plasma generation is introduced into the plasma generating chamber 122 through the gas inlet pipe 124. At the same time, the chambers 100 and 122 are evacuated through the exhaust pipes 120 by means of the vacuum pump (not shown). Thereupon, the chambers 100 and 122 are kept at a predetermined vacuum pressure inside. Also, the magnetic coil 128 forms a magnetic field of a predetermined density, e.g., 875 G, in the plasma generating chamber 122.

When various necessary conditions for plasma etching are thus met in the treatment chamber 100 and the plasma generating chamber 122, the magnetron in the microwave generating chamber 134 generates $TE_{11}$-mode microwaves (e.g., at 2.45 GHz). These microwaves are propagated through the circular waveguide 130 that has the sectional shape shown in FIG. 2A, 3A or 4A. As mentioned before, the inner surface regions of the waveguide 130 that are situated in the electric-field direction of the microwaves are formed having the axially symmetrical wavy shape, axially symmetrical low-curvature arcuate shape, or flat shape. In this case, therefore, the electric lines of force (electric-field vectors) of the $TE_{11}$-mode microwaves that are propagated through the waveguide 130 extend at right angles to the inner surface of the waveguide 130 in a manner such that their curvatures are low. More specifically, the density concentration of the electric lines of force is eased inside the waveguide 130 so that the intervals between the electric lines are substantially uniform in the direction of the magnetic line of force. Accordingly, the electric-field intensity of the $TE_{11}$-mode microwaves is substantially uniform in the direction of the magnetic line of force (magnetic-field direction).

The $TE_{11}$-mode microwaves, of which the electric-field intensity is regulated uniformly in the direction of the magnetic line of force, are introduced through the insulating wall 132 into the plasma generating chamber 122, in which the predetermined magnetic field is formed by the agency of the magnetic coil 128. When the microwaves are introduced into the chamber 122 in this manner, electric discharge is excited in the chamber 122. An ECR plasma is formed as electrons undergo a cyclotron motion during this discharge. This plasma is derived from microwaves with a uniform electric-field intensity, and its density distribution is uniform and dense.

The uniform-density plasma formed in the plasma generating chamber 122 causes reaction gases (e.g., carbon fluoride and oxygen) in the treatment gas A, which is introduced into the treatment chamber 100, to dissociate, thereby producing radicals. In the chamber 100, high-frequency bias power from the high-frequency power source 116 is supplied to the stage 104 through the matching circuit 114, and the gases are discharged through the exhaust pipes 120. Accordingly, the plasma and radicals are guided to the stage 104, whereupon the silicon oxide film on the wafer W on the stage 104 is uniformly etched with them.

During this etching process, helium gas at several Torr, for example, is introduced into the region between the wafer W and the stage 104 through the gas supply pipe 112 and the gas supply holes 140. This helium gas improves the rate of heat transfer between the wafer W and the stage 104, and allows heat generated from the wafer W during a plasma treatment to be efficiently transferred to the stage 104, thereby preventing the temperature of the wafer W from rising excessively. During the etching process, moreover, the cooling medium, such as water, is circulated through the circuit 126 in the side wall portion of the plasma generating chamber 122, in order to dissipate heat generated in the chamber 122, thereby keeping the temperature in the chamber 122 at a predetermined temperature.

In the ECR etching apparatus 150 according to the present embodiment, as described above, the inner surface regions of the circular waveguide 130 are deformed so that the electric-field intensity of the $TE_{11}$-mode microwaves is uniform in the direction of the magnetic line of force. Accordingly, the $TE_{11}$-mode microwaves having the uniform electric-field intensity are propagated into the plasma generating chamber 122 through the circular waveguide 130, so that a plasma having a uniform density distribution is formed in the chamber 122. Thus, the semiconductor wafer W can be etched uniformly.

Although a semiconductor wafer has been described as an example of an object of treatment according to the present embodiment, the object of treatment is not limited to the semiconductor wafer, and may alternatively be an LCD or glass substrate. According to the embodiment described above, moreover, an ECR etching apparatus is taken as an example of a microwave plasma treatment apparatus. However, the plasma treatment apparatus is not limited to the ECR etching apparatus, and may be any other treatment apparatus, such as an ECR plasma CVD apparatus, microwave plasma CVD apparatus, or ashing apparatus, that includes the circular waveguide 130 with the aforementioned construction. According to the embodiment described herein, furthermore, three examples are given for the inner surface shape of the circular waveguide 130. However, the waveguide 130 may have any other suitable inner surface shape provided that the electric-field intensity of the $TE_{11}$-mode microwaves can be made uniform in the direction of the magnetic line of force.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A microwave plasma treatment apparatus for treating an object of treatment, comprising:

microwave generating means for generating $TE_{11}$-mode microwaves;

a circular waveguide for propagating the $TE_{11}$-mode microwaves generated from the microwave generating means;

plasma generating means for generating a plasma by using the $TE_{11}$-mode microwaves propagated through the circular waveguide;

a treatment chamber for treating the object of treatment with the plasma generated by the plasma generating means;

a stage provided in the treatment chamber, on which the object of treatment is to be placed; and an electrical insulating wall connecting the circular waveguide and the plasma generating means, wherein two inner surface regions of the circular waveguide opposed to each other in the electric-field direction of the microwaves are deformed so electric lines of force of the microwaves introduced in $TE_{11}$-mode extend in a substantially linearly fashion and are spaced apart at substantially regular intervals in the magnetic-field direction of the microwaves, wherein the two inner surface regions opposed to each other are symmetric to an axis passing therethrough and extending through a center of the waveguide in an electric field direction, and wherein all inner surface regions other than the two inner surface regions opposed to each other have a circular contour and are absent of deformed regions.

2. A microwave plasma treatment apparatus according to claim 1, wherein said two inner surface regions of the circular waveguide opposed to each other in the electric-field direction of the microwaves respectively describe arcuate curves having a curvature lower than that of the circular contour of the waveguide in a section of the waveguide viewed along a plane perpendicular to the direction of propagation of the microwaves.

3. A microwave plasma treatment apparatus according to claim 2, wherein each of said two opposite arcuate curves is symmetrical with respect to an axis extending past the center of the circular waveguide in the electric-field direction, and said two arcuate curves are symmetrical with respect to an axis that extending past the center of the waveguide in the magnetic-field direction.

4. A microwave plasma treatment apparatus according to claim 1, wherein said two inner surface regions of the circular waveguide opposed to each other in the electric-field direction of the microwaves are flat.

5. A microwave plasma treatment apparatus according to claim 4, wherein said plasma generating means includes a plasma generating chamber connected to the circular waveguide and used to generate the plasma therein, and the sectional shape of the plasma generating chamber along a plane perpendicular to the direction of propagation of microwaves is substantially identical with or similar to the sectional shape of the circular waveguide along a plane perpendicular to the direction of propagation of microwaves.

6. A microwave plasma treatment apparatus according to claim 4, wherein said microwave generating means comprises:

means for generating $TE_{10}$-mode microwaves;

a rectangular waveguide for guiding the $TE_{10}$-mode microwaves; and means for converting the $TE_{10}$-mode microwaves propagating through the rectangular waveguide into $TE_{11}$-mode microwaves.

7. A microwave plasma treatment apparatus according to claim 1, wherein said plasma generating means includes a plasma generating chamber connected to the circular waveguide and used to generate the plasma therein, and the sectional shape of the plasma generating chamber along a plane perpendicular to the direction of propagation of microwaves is substantially identical with or similar to the sectional shape of the circular waveguide along a plane perpendicular to the direction of propagation of microwaves.

8. A microwave plasma treatment apparatus according to claim 1, wherein said microwave generating means comprises:

means for generating $TE_{10}$-mode microwaves;

a rectangular waveguide for guiding the $TE_{10}$-mode microwaves; and means for converting the $TE_{10}$-mode microwaves propagating through the rectangular waveguide into $TE_{11}$-mode microwaves.

9. A microwave plasma treatment apparatus according to claim 2, wherein said plasma generating means includes a plasma generating chamber connected to the circular waveguide and used to generate the plasma therein, and the sectional shape of the plasma generating chamber along a plane perpendicular to the direction of propagation of microwaves is substantially identical with or similar to the sectional shape of the circular waveguide along a plane perpendicular to the direction of propagation of microwaves.

10. A microwave plasma treatment apparatus according to claim 2, wherein said microwave generating means comprises:

means for generating $TE_{10}$-mode microwaves;

a rectangular waveguide for guiding the $TE_{10}$-mode microwaves; and means for converting the $TE_{10}$-mode microwaves propagating through the rectangular waveguide into $TE_{11}$-mode microwaves.

11. A microwave plasma treatment apparatus according to claim 1, wherein said two inner surface regions of the circular waveguide opposed to each other in the electric-field direction of the microwaves respectively describe wavy curves in a section of the waveguide viewed along a plane perpendicular to the direction of propagation of the microwaves.

12. A microwave plasma treatment apparatus for treating an object of treatment, comprising:

microwave generating means for generating $TE_{11}$-mode microwaves;

a circular waveguide for propagating the $TE_{11}$-mode microwaves generated from the microwave generating means;

plasma generating means for generating a plasma by using the $TE_{11}$-mode microwaves propagated through the circular waveguide;

a treatment chamber for treating the object of treatment with the plasma generated by the plasma generating means;

a stage provided in the treatment chamber, on which the object of treatment is to be placed; and An electrical insulating wall connecting the circular waveguide and the plasma generating means, wherein two inner surface regions of the circular waveguide opposed to each other in the electric-field direction of the microwaves are deformed so an electric field in the treatment chamber is uniform in the magnetic-field direction of the microwaves, wherein the two inner surface regions opposed to each other are symmetric to an axis passing therethrough and extending through a center of the waveguide in an electric field direction, and wherein all inner surface regions other than the two inner surface regions opposed to each other have a circular contour and are absent of deformed regions.

* * * * *